United States Patent
Wagner et al.

(10) Patent No.: US 11,851,342 B2
(45) Date of Patent: Dec. 26, 2023

(54) TRIS(TRICHLOROSILY1) DICHLOROGALLYLGERMANE, PROCESS FOR THE PREPARATION THEREOF AND USE THEREOF

(71) Applicant: Evonik Operations GmbH, Essen (DE)

(72) Inventors: Matthias Wagner, Maintal/Doernigheim (DE); Julian Teichmann, Frankfurt am Main (DE); Hans-Wolfram Lerner, Oberursel (DE)

(73) Assignee: Evonik Operations GmbH, Essen (DE)

(*) Notice: Subject to any disclaimer, the term of this patent is extended or adjusted under 35 U.S.C. 154(b) by 306 days.

(21) Appl. No.: 17/309,253

(22) PCT Filed: Nov. 7, 2019

(86) PCT No.: PCT/EP2019/080530
§ 371 (c)(1),
(2) Date: May 12, 2021

(87) PCT Pub. No.: WO2020/099233
PCT Pub. Date: May 22, 2020

(65) Prior Publication Data
US 2022/0017380 A1   Jan. 20, 2022

(30) Foreign Application Priority Data

Nov. 14, 2018  (EP) .................................... 18206148

(51) Int. Cl.
*C01G 17/00*  (2006.01)

(52) U.S. Cl.
CPC .................................. *C01G 17/006* (2013.01)

(58) Field of Classification Search
CPC ..................................................... C01G 17/006
See application file for complete search history.

(56) References Cited

U.S. PATENT DOCUMENTS

| 10,414,783 B2 | 9/2019 | Teichmann et al. |
| 10,618,921 B2 | 4/2020 | Teichmann et al. |
| 10,730,754 B2 | 8/2020 | Teichmann et al. |
| 2008/0044932 A1 | 2/2008 | Samoilov et al. |
| 2010/0151666 A1 | 6/2010 | Kouvetakis et al. |
| 2018/0346494 A1 | 12/2018 | Teichmann et al. |
| 2018/0346495 A1 | 12/2018 | Teichmann et al. |

(Continued)

FOREIGN PATENT DOCUMENTS

| DE | 4306106 | 9/1994 |
| JP | H07-316860 | 12/1995 |
| TW | 201328973 | 7/2013 |

(Continued)

OTHER PUBLICATIONS

Joiner-1973 (Year: 1973).*

(Continued)

*Primary Examiner* — Anthony J Zimmer
*Assistant Examiner* — Jordan W Taylor
(74) *Attorney, Agent, or Firm* — Grüneberg and Myers PLLC

(57) ABSTRACT

A process can be used for the preparation of tris(trichlorosilyl)dichlorogallylgermane, which is a chlorinated, uncharged substance.

20 Claims, 2 Drawing Sheets

Crystal structure of Ge(SiCl$_3$)$_3$GaCl$_2$ (1), which exists in crystalline form as a dimer.

(56) References Cited

U.S. PATENT DOCUMENTS

| | | |
|---|---|---|
| 2020/0165278 A1 | 5/2020 | Teichmann et al. |
| 2020/0180966 A1 | 6/2020 | Teichmann et al. |

FOREIGN PATENT DOCUMENTS

| | | |
|---|---|---|
| WO | 03/059808 | 7/2003 |
| WO | 2004/036631 | 4/2004 |
| WO | 2020/099242 | 5/2020 |

OTHER PUBLICATIONS

Lobreyer et al. Angew. Chem. Int. Ed. Engl. 1993, 32. No. 4 (Year: 1993).*

Muller et al. Journal of Organometallic Chemistry 579 (1999)156 163 (Year: 1999).*

International Search Report dated Feb. 12, 2020 in PCT/EP2019/080530 with English translation, 8 pages.

Written Opinion dated Feb. 12, 2020 in PCT/EP2019/080530 with English translation, 9 pages.

Lobreyer et al., "*Synthese und Struktur von Tetrasilylgerman, Ge(SiH$_3$)$_4$, und weiteren Silylgermanen*", Angew. Chem., 1993, vol. 105, pp. 587-588.

Müller et al., "*Trichlorosilylation of chlorogermanes and chlorostannanes with HSiCl$_3$/Net$_3$ followed by base-catalysed formation of (Me$_3$Ge)$_2$Si(SiCl$_3$)$_2$ and related branched stannylsilanes*", Journal of Organometallic Chemistry, 1999, vol. 579, pp. 156-163.

Ritter et al., "*Synthesis and Fundamental Studies of* (H$_3$Ge)$_x$SiH$_{4-x}$ *Molecules: Precursors to Semiconductor Hetero-and Nanostructures on Si*", Journal of the American Chemical Society, 2005, vol. 127, pp. 9855-9864.

Teichmann et al., "*Tris(trichlorosilyl)tetrelide Anions and a Comparative Study of Their Donor Qualities*", Chemistry—A European Journal Communication, 2019, pp. 2740-2744.

U.S. Pat. No. 10,414,783, Sep. 17, 2019, 2018/0346494, Teichmann et al.

U.S. Pat. No. 10,730,754, Aug. 4, 2020, 2020/0180966, Teichmann et al.

U.S. Pat. No. 10,618,921, Apr. 14, 2020, 2018/0346495, Teichmann et al.

U.S. Appl. No. 16/774,682, filed Jan. 28, 2020, 2020/0165278, Teichmann et al.

Hinchley et al., "Steric and electronic effects on Si—Ge bond lengths: An experimental and theoretical structural study of Me$_2$Ge(SiCl$_3$)$_2$ and Me$_3$GeSiCl$_3$", Inorganica Chimica Acta, vol. 360, 2007, pp. 1323-1331.

Schwan et al., "Reactions of gallium(III) chloride with Li[E(SiMe$_3$)$_3$] (E = Si or Ge): crystal structure of (R$_3$Ge)ClGa(μ-OEt)$_2$GaCl(GeR$_3$) (R = SiMe$_3$)", Journal of Chem. Soc., Dalton Trans., 1996, pp. 4183-4187.

Albers et al., "Wagner-Meerwein-Type Rearrangements of Germapolysilanes—A Stable Ion Study", Organometallics, vol. 34, 2015, pp. 3756-3763.

Olaru et al., "The Weakly Coordinating Tris(trichlorosilyl)silyl Anion", Angew. Chem. Int. Ed., vol. 56, 2017, pp. 16490-16494.

\* cited by examiner

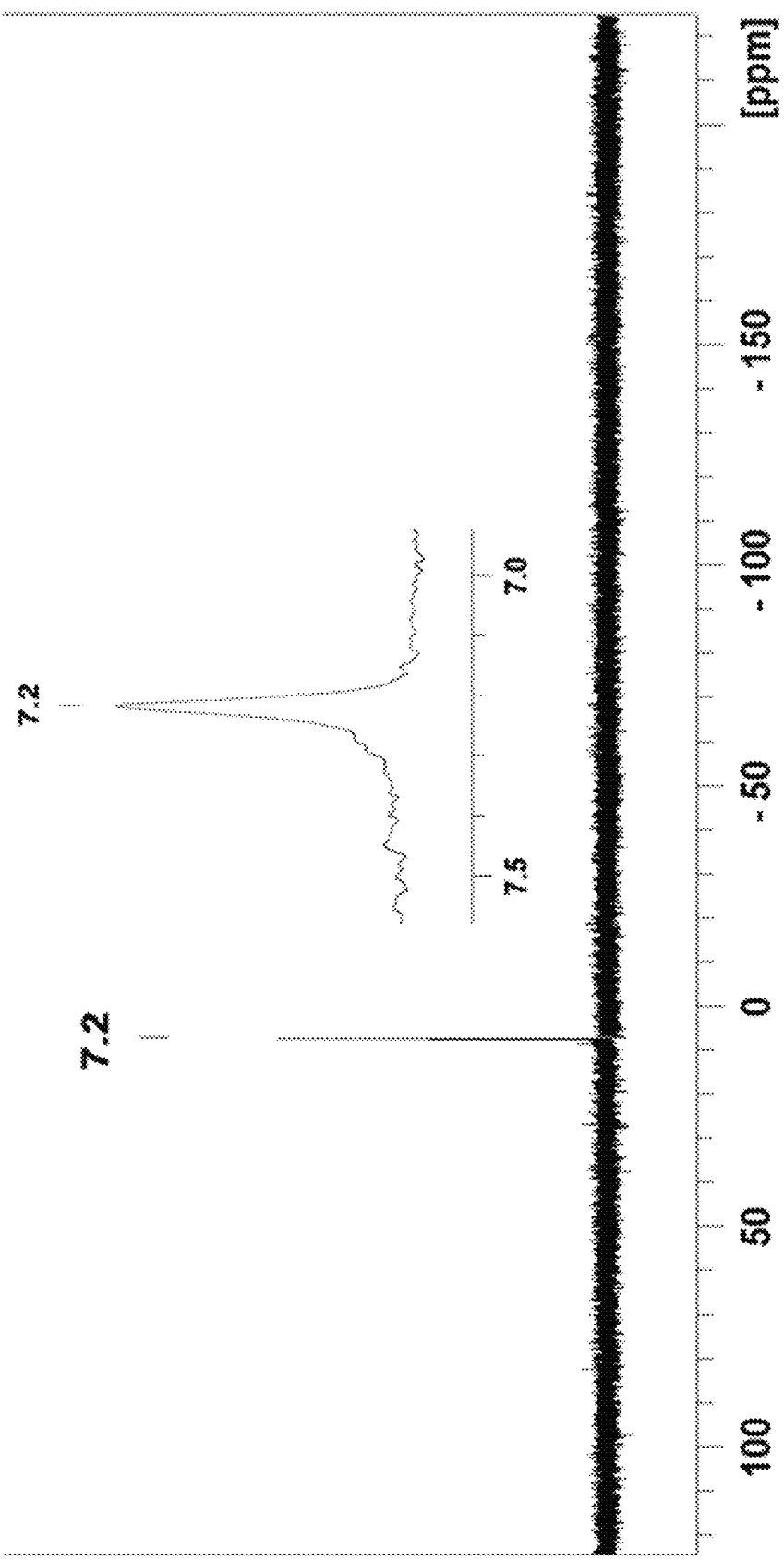
Fig. 1A: $^{29}$Si NMR spectrum of Ge(SiCl$_3$)$_3$GaCl$_2$ (*1*).

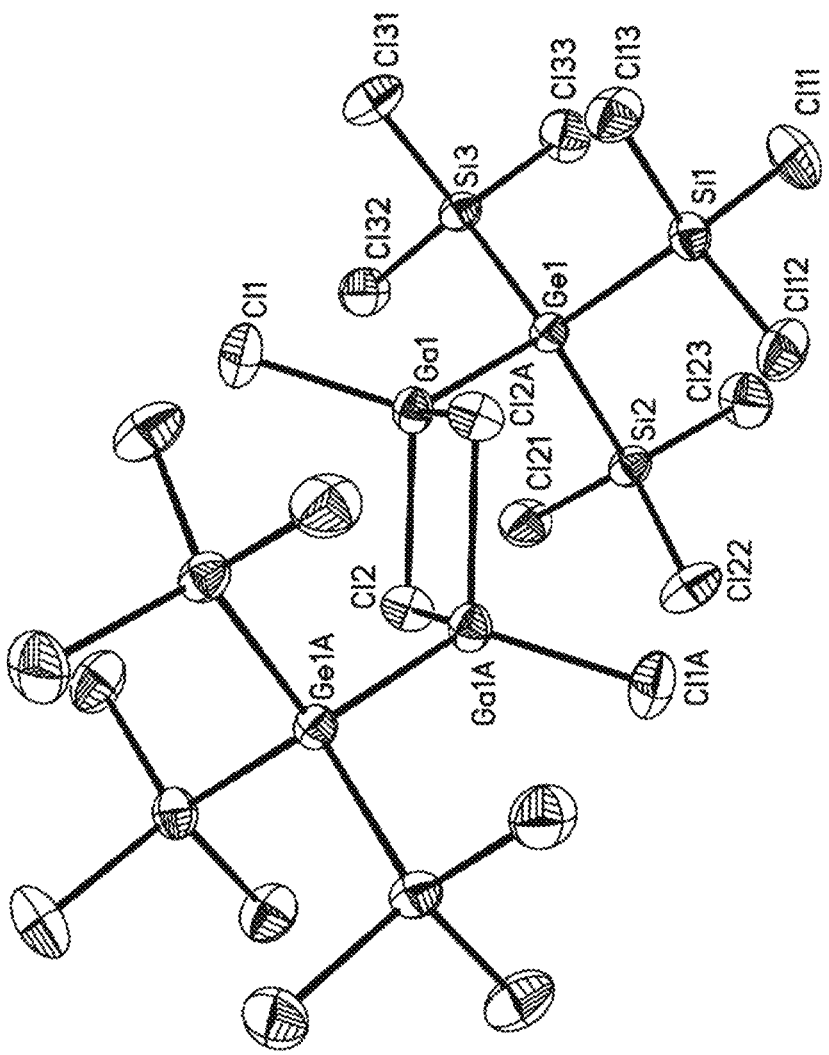
Fig. 1B: Crystal structure of Ge(SiCl$_3$)$_3$GaCl$_2$ (*1*), which exists in crystalline form as a dimer.

TRIS(TRICHLOROSILY1) DICHLOROGALLYLGERMANE, PROCESS FOR THE PREPARATION THEREOF AND USE THEREOF

CROSS-REFERENCE TO RELATED APPLICATIONS

This application is the National Stage entry under § 371 of International Application No. PCT/EP2019/080530, filed on Nov. 7, 2019, and which claims the benefit of European Application No, 18206148.1, filed on Nov. 14, 2018. The content of each of these applications is hereby incorporated by reference in its entirety.

BACKGROUND OF THE INVENTION

Field of the Invention

The present invention relates to the novel, chlorinated, uncharged substance tris(trichlorosilyl)dichlorogallylgermane, to a process for the preparation thereof and also to the use thereof.

Description of Related Art

Halosilanes, polyhalosilanes, halogermanes, polyhalogermanes, silane, polysilanes, germane, polygermanes and corresponding mixed compounds have long been known, cf., in addition to the customary textbooks of inorganic chemistry, also WO 2004/036631 A2 or C. J. Ritter et al., J. Am. Chem. Soc., 2006, 127, 9855-9864.

Lars Müller et al, in J. Organomet. Chem. 1999, 579, 156-183, describe a method for producing Si—Ge bonds by reacting partially chlorinated organic germanium compounds with trichlorosilane while adding triethylamine.

Thomas Lobreyer et al. propose a further possibility for producing neutral Si—Ge compounds by means of the reaction of $SiH_4$ and $GeH_4$ with sodium (Angew. Chem. 1993, 105, 587-588).

Patent applications EP 171739402, EP 17173951.9 and EP 17173959.2 disclose further Si—Ge compounds and processes for the preparation thereof.

Thus, for the purposes of fundamental research, the aim is to find novel compounds and to seek novel preparation routes, in particular also with respect to potential industrial and optionally improvable applications.

SUMMARY OF THE INVENTION

The present invention is based on the object of providing a novel synthesis possibility for preparing an uncharged silicon-germanium compound without using pyrophoric or toxic substances.

A completely novel synthesis possibility was found in the reaction of ammonium or phosphonium tris(trichlorosdlyl) germanide salts of the $[R_4N][Ge(SiCl_3)_3]$ or $[R_4P][Ge(SiCl_3)_3]$ type with $GaCl_3$ and alkylic or aromatic radicals R, which results in an uncharged, chlorinated and gallium-doped Si—Ge compound. What is surprising with this novel synthesis is, inter alia, that gallium is introduced into an existing Si—Ge compound in just one step and the resulting tris(trichlorosilyl)dichlorogallylgermane is uncharged.

The invention accordingly provides the substance tris(trichlorosilyl)dichlorogallylgermane of the formula (I):

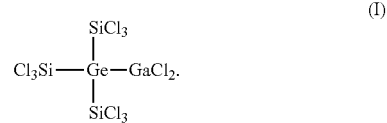

(I)

The invention likewise provides the process for preparing the tris(trichlorosilyl)dichlorogallylgermane according to the invention, by
(a) mixing at least one tris(trichlorosilyl)germanide salt of the $[X][Ge(SiCl_3)_3]$ type where
   X=ammonium (RAN) and/or phosphonium ($R_4P$),
   R=alkylic or aromatic radical.
   with $GaCl_3$, and
(b) reacting same in an environment consisting of at least one chlorinated hydrocarbon at a temperature of 5 to 40° C. to obtain a crude product comprising salts $[R_4N][GaCl_4]$ and/or $[R_4P][GaCl_4]$ and tris(trichlorosilyl)dichlorogallylgermane,
and subsequently
(c) introducing said crude product into at least one nonpolar solvent and separating off the insoluble residue, and subsequently
(d) removing the nonpolar solvent.
to obtain tris(trichlorosilyl)dichlorogallylgermane.

BRIEF DESCRIPTION OF THE DRAWINGS

FIG. 1A shows the $^{29}Si$ NMR spectrum of $Ge(SiCl_3)_3GaCl_2$.

FIG. 1B shows the crystal structure of $Ge(SiCl_3)_3GaCl_2$.

DETAILED DESCRIPTION OF THE INVENTION

The process has the advantage that neither pyrophoric nor toxic substances such as, for example, $SiH_4$, $GeH_4$ or sodium need to be used. It is true that processes are already known in the prior art that avoid the use of such hazardous substances. However, these conventional processes generally yield neutral Si—Ge compounds with organic radicals. Organic radicals prevent the use of the Si—Ge compounds in those deposition reactions that are of interest for semiconductor electronics, because SiC is formed at the temperatures that are set during the deposition. SiC is nonconductive and destroys the desired conductive or semiconductive property of Si—Ge layers.

Nor can salt-type Si—Ge compounds be used in semiconductor electronics, since organic radicals are present in such substances.

In contrast, in the process according to the invention neither a salt-type Si—Ge compound is produced, nor are organic radicals present. Instead, in the claimed process, an already existing Si—Ge compound is doped with gallium in a single step, and in the process a salt-type starting material is converted into an uncharged, non-ionic product. An additional, immensely important advantage that emerges is thus that the tris(trichlorosily)dichlorogallylgermane according to the invention or obtained according to the invention can be used without problems in semiconductor electronics.

The invention therefore likewise provides for the use or the tris(trichlorosilyl)dichlorogallylgermane according to the invention or of the tris(trichlorosilyl)dichlorogallylgermane prepared by the process according to the invention as precursor for the deposition of gallium-doped Si—Ge layers.

The invention is explained in more detail hereafter.

In step a of the process according to the invention, 2 equivalents of $GaCl_3$ can preferably be used per equivalent of tris(trichlorosilyl)germanide salt of the $[X][Ge(SiCl_3)_3]$ type, where X=ammonium ($R_4N$) and/or phosphonium ($R_4P$).

In the reaction that takes place in step b of the process according to the invention, a $GaCl_2$ group adds onto the central germanium atom, and the chlorinated, uncharged compound $Ge(SiCl_3)_3GaCl_2$ forms in the crude product.

The ammonium or phosphonium chloride salts form salts with $GaCl_3$ of the $[R_4N][GaCl_4]$ or $[R_4P][GaCl_4]$ type that are likewise present in the crude product. The uncharged molecule of the formula (I) is separated off from these salt-type compounds by extraction with nonpolar solvents and obtained in pure form. Suitable nonpolar solvents are advantageously pentane, hexane and/or benzene. Particularly preferably, n-hexane can be used.

The reaction in step b of the process according to the invention can advantageously be conducted at room temperature. In addition or as an alternative to this option, in step d the nonpolar solvent can be removed at room temperature.

It may additionally be advantageous when, in step b of the process according to the invention, the chlorinated hydrocarbon used is dichloromethane $CH_2Cl_2$.

One further option consists in choosing R=Et in step b of the process according to the invention.

Preferably, in step c of the process according to the invention, the nonpolar solvent can be selected from hexane, n-hexane, pentane and/or benzene. Particularly preferably, n-hexane can be used in step c.

A further-preferred embodiment of the process according to the invention consists, in step a, in $[X][Ge(SiCl_3)_3]$ and $GaCl_3$, these components preferably being in the solid state, being mixed by means of stirring, preferably mixed in an oxygen-free environment, particularly preferably under protective gas, nitrogen or argon, and, in step b, the mixture obtained in step a is completely dissolved in the chlorinated hydrocarbon(s), and, after a time of 0.1 to 24 hours, preferably after 1 to 5 hours, the chlorinated hydrocarbon(s) are removed, preferably at a temperature of 5 to 40° C., particularly preferably at room temperature, additionally preferably in an oxygen-free, dry environment, particularly preferably in an isolated environment, additionally preferably under standard pressure or reduced pressure, particularly preferably in the range from 1 to 500 hPa.

It may additionally be advantageous when, in step c of the process according to the invention, after the introduction of the crude product, the temperature of the nonpolar solvent(s) is brought for from 1 to 5 times, preferably 3 times, from RT to elevated temperature, preferably to the boiling point at least of one nonpolar solvent, and subsequently allowed to cool, preferably to RT.

The example which follows provides additional explanation of the present invention without restricting the subject-matter. The term "room temperature" is abbreviated to "RT".

Example 1 describes the reaction of $[Et_4N][Ge(SiCl_3)_3]$ with $GaCl_3$. The reaction of other ammonium or phosphonium (trichlorosilyl)germanide salts of the $[R_4N][Ge(SiCl_3)_3]$ or $[R_4P][Ge(SiCl_3)_3]$ type can be conducted analogously.

Analytical Methods for Determination of the Crystal Structure

The data for all structures were collected at 173 K using a STOE IPDS II two-circle diffractometer with a Genix microfocus tube having mirror optics using $MoK_\alpha$ radiation ($\lambda$=0.71073 Å) and scaled using the frame scaling procedure of the X-AREA program (Sloe & Cie, 2002). The structures were solved by direct methods with the aid of the SHELXS program (Sheldrick, 2008) and refined on $F^2$ by the full matrix least squares technique. Cell parameters were determined by refinement on $\theta$ values of the reflections with $I>6\sigma(I)$.

Example 1: Preparation of Tris(Trichlorosilyl)Dichlorogallylgermane (1)

The synthesis was effected in accordance with Equation 1 from $[Et_4N][Ge(SiCl_3)_3]$ with $GaCl_3$ while adding $CH_2Cl_2$.

Equation 1:
Reaction of $[Et_4N][Ge(SiCl_3)_3]$ and $GaCl_3$ at RT while adding $CH_2Cl_2$.

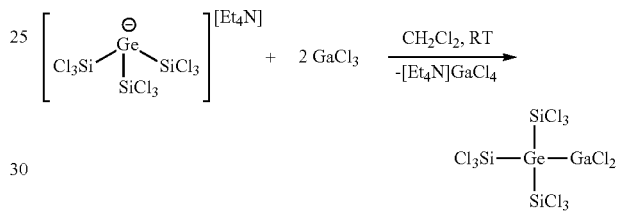

The reaction was conducted in a glovebox.

$[Et_4N][Ge(SiCl_3)_3]$ at an amount of 0.050 g, corresponding to 0.082 mmol, and $GaCl_3$ at an amount of 0.028 g, corresponding to 0.16 mmol, were mixed in the solid state and subsequently completely dissolved in dichloromethane $CH_2Cl_2$.

The dichloromethane was slowly evaporated at RT after 3 hours. After one day, a mixture of $Ge(SiCl_3)_3GaCl_2$ (1) and $[Et_4N][GaCl_4]$ had formed as crystalline crude product. The crude product was heated to boiling three times with in each case 7 ml of n-hexane. Subsequently, the clear, colourless n-hexane solution was separated off from the insoluble residue with a syringe.

The nonpolar solvent was subsequently removed slowly at RT, and after one day it was possible to isolate $Ge(SiCl_3)_3GaCl_2$ (1) as a crystalline substance.

The $^{29}Si$ NMR spectrum of the inventive product 1 is presented in FIG. 1A, and the result of the analysis thereof by means of X-ray diffractometry is presented in FIG. 1B.

The data of the $^{29}Si$ NMR spectroscopy analysis:
$^{29}Si$ NMR (99.4 MHz, $CD_2Cl_2$, 298 K): $\delta$=7.2 ppm.

The invention claimed is:
1. Tris(trichlorosilyl)dichlorogallylgermane of the formula (I):

(I)

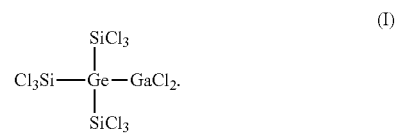

2. A process for preparing the tris(trichlorosilyl)dichlorogallylgermane according to claim 1, the process comprising:
(a) mixing at least one tris(trichlorosilyl)germanide salt of an [X][Ge(SiCl$_3$)$_3$] type, wherein X=ammonium (R$_4$N) and/or phosphonium (R$_4$P), and wherein R=an alkylic or aromatic radical,
with GaCl$_3$, to obtain a mixture, and
(b) reacting the mixture in an environment consisting of at least one chlorinated hydrocarbon at a temperature of 5 to 40° C., to obtain a crude product comprising salts [R$_4$N][GaCl$_4$] and/or [R$_4$P][GaCl$_4$] and tris(trichlorosilyl)dichlorogallylgermane, and subsequently
(c) introducing said crude product into at least one nonpolar solvent and separating off the insoluble residue, and subsequently
(d) removing the at least one nonpolar solvent, to obtain tris(trichlorosilyl)dichlorogallylgermane.

3. The process according to claim 2, wherein in (b), the reaction is conducted at room temperature, and/or
wherein in (d), the at least one nonpolar solvent is removed at room temperature.

4. The process according to claim 2, wherein in (b), the at least one chlorinated hydrocarbon is dichloromethane (CH$_2$Cl$_2$).

5. The process according to claim 2, wherein in (b), R=Et.

6. The process according to claim 2, wherein in (c), the at least one nonpolar solvent is selected from the group consisting of hexane, n-hexane, pentane, and benzene.

7. The process according to claim 2, wherein
in (a), [X] [Ge(SiCl$_3$)$_3$] and GaCl$_3$ are mixed by stirring,
in (b), the mixture obtained in (a) is completely dissolved in the at least one chlorinated hydrocarbon, and
after a time of 0.1 to 24 hours, the at least one chlorinated hydrocarbon is removed.

8. The process according to claim 2, wherein
in (c), after the introduction of the crude product, the temperature of the at least one nonpolar solvent is brought from room temperature to an elevated temperature and is subsequently allowed to cool, for a total from 1 to 5 times.

9. A method of deposition of gallium-doped Si—Ge layers, the method comprising:
reacting the tris(trichlorosilyl)dichlorogallylgermane according to claim 1 as a precursor, to deposit the gallium-doped Si—Ge layers.

10. The process according to claim 6, wherein the at least one nonpolar solvent is n-hexane.

11. The process according to claim 7, wherein [X][Ge(SiCl$_3$)$_3$] and GaCl$_3$ are in a solid state.

12. The process according to claim 7, wherein the mixing in (a) is performed in an oxygen-free environment.

13. The process according to claim 7, wherein the mixing in (a) is performed under protective gas.

14. The process according to claim 7, wherein in (b), the at least one chlorinated hydrocarbon is removed after 1 to 5 hours.

15. The process according to claim 7, wherein in (b), the at least one chlorinated hydrocarbon is removed at room temperature.

16. The process according to claim 7, wherein in (b), the at least one chlorinated hydrocarbon is removed in an oxygen-free, dry environment.

17. The process according to claim 7, wherein in (b), the at least one chlorinated hydrocarbon is removed at a pressure in a range from 1 to 500 hPa.

18. The process according to claim 8, wherein the nonpolar solvent is brought from room temperature to an elevated temperature, for a total of 3 times.

19. The process according to claim 8, wherein the elevated temperature is the boiling point temperature of the at least one nonpolar solvent.

20. The process according to claim 8, wherein the cooling of the at least one nonpolar solvent is to room temperature.

* * * * *